(12) United States Patent
Hata et al.

(10) Patent No.: US 10,224,469 B2
(45) Date of Patent: Mar. 5, 2019

(54) LIGHT EMITTING DEVICE AND METHOD FOR MANUFACTURING LIGHT EMITTING DEVICE

(71) Applicant: SHARP KABUSHIKI KAISHA, Sakai, Osaka (JP)

(72) Inventors: Toshio Hata, Sakai (JP); Makoto Agatani, Sakai (JP); Shinya Ishizaki, Sakai (JP); Makoto Matsuda, Sakai (JP); Tomokazu Nada, Sakai (JP); Toyonori Uemura, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/271,762

(22) Filed: Sep. 21, 2016

(65) Prior Publication Data

US 2017/0012189 A1   Jan. 12, 2017

Related U.S. Application Data

(62) Division of application No. 14/419,841, filed as application No. PCT/JP2013/068966 on Jul. 11, 2013, now Pat. No. 9,484,309.

(30) Foreign Application Priority Data

Aug. 6, 2012  (JP) .................................. 2012-174009

(51) Int. Cl.
*H01L 33/60*   (2010.01)
*H01L 23/544*  (2006.01)
(Continued)

(52) U.S. Cl.
CPC ............ *H01L 33/60* (2013.01); *G03F 9/7073* (2013.01); *H01L 23/544* (2013.01);
(Continued)

(58) Field of Classification Search
CPC ....... H01L 33/36; H01L 33/38; H01L 33/483; H01L 33/486; H01L 33/507; H01L 33/62;
(Continued)

(56) References Cited

U.S. PATENT DOCUMENTS 3,903,344 A   9/1975 Laiming
8,575,630 B2  11/2013 Ito et al.
(Continued)

FOREIGN PATENT DOCUMENTS

JP   56-017386   2/1981
JP   11-126971   5/1999
(Continued)

OTHER PUBLICATIONS

International Search Report for PCT/JP2013/068966 dated Aug. 20, 2013, 4 pages.
(Continued)

*Primary Examiner* — Fei Fei Yeung Lopez
(74) *Attorney, Agent, or Firm* — ScienBiziP, P.C.

(57) ABSTRACT

A light emitting device (10) includes light emitting elements (12), conductor wirings (14), and alignment marks (18) formed on a substrate (11). The alignment marks (18) and the conductor wirings (14) are formed by printing.

5 Claims, 6 Drawing Sheets

(51) Int. Cl.
*G03F 9/00* (2006.01)
*H01L 25/075* (2006.01)
*H01L 33/62* (2010.01)
*H05K 1/02* (2006.01)
*H01L 33/48* (2010.01)
*H05K 3/12* (2006.01)
*H05K 3/28* (2006.01)

(52) U.S. Cl.
CPC ........ *H01L 25/0753* (2013.01); *H01L 33/486* (2013.01); *H01L 33/62* (2013.01); *H05K 1/0269* (2013.01); *G03F 9/708* (2013.01); *G03F 9/7076* (2013.01); *G03F 9/7084* (2013.01); *H01L 2223/54426* (2013.01); *H01L 2223/54473* (2013.01); *H01L 2223/54486* (2013.01); *H01L 2224/45144* (2013.01); *H01L 2224/48137* (2013.01); *H05K 3/12* (2013.01); *H05K 3/28* (2013.01); *H05K 2201/09918* (2013.01); *H05K 2201/09936* (2013.01)

(58) Field of Classification Search
CPC ......... H01L 23/544; H01L 2223/54426; H01L 2223/54473; H01L 2223/54486; G03F 9/7073; G03F 9/7076; G03F 9/708; G03F 9/7084
See application file for complete search history.

(56) References Cited

U.S. PATENT DOCUMENTS

| | | | |
|---|---|---|---|
| 8,680,546 B2 | 3/2014 | Konishi et al. | |
| 8,735,914 B2 | 5/2014 | Agatani et al. | |
| 8,796,706 B2 | 8/2014 | Jung et al. | |
| 8,835,970 B2 | 9/2014 | Konishi et al. | |
| 9,048,391 B2 | 6/2015 | Jung et al. | |
| 2004/0003673 A1 | 1/2004 | Korenjak | |
| 2004/0036731 A1* | 2/2004 | Ready | H01L 21/288 347/19 |
| 2007/0085101 A1* | 4/2007 | Kim | H01L 33/60 257/98 |
| 2009/0034296 A1* | 2/2009 | Saito | H04N 1/02815 362/623 |
| 2009/0315057 A1 | 12/2009 | Konishi et al. | |
| 2011/0254022 A1* | 10/2011 | Sasano | H01L 25/0753 257/88 |
| 2011/0278605 A1* | 11/2011 | Agatani | H01L 25/0753 257/89 |
| 2011/0316011 A1 | 12/2011 | Ito et al. | |
| 2011/0317416 A1* | 12/2011 | Oyaizu | H05B 33/0806 362/235 |
| 2012/0056217 A1 | 3/2012 | Jung et al. | |
| 2012/0080713 A1 | 4/2012 | Agatani et al. | |
| 2014/0159092 A1 | 6/2014 | Konishi et al. | |
| 2014/0312380 A1 | 10/2014 | Jung et al. | |
| 2014/0361331 A1 | 12/2014 | Konishi et al. | |
| 2015/0214453 A1 | 7/2015 | Jung et al. | |

FOREIGN PATENT DOCUMENTS

| | | |
|---|---|---|
| JP | 2004-207655 A | 7/2004 |
| JP | 2007-273914 | 10/2007 |
| JP | 2010-34487 A | 2/2010 |
| JP | 2010-205920 A | 9/2010 |
| JP | 2012-4519 A | 1/2012 |
| JP | 2012-009781 | 1/2012 |
| JP | 2012-015329 | 1/2012 |
| JP | 2012-079855 | 4/2012 |
| WO | 2011/002208 A2 | 1/2011 |
| WO | 2011/002208 A3 | 1/2011 |
| WO | WO 2012/057038 | 5/2012 |

OTHER PUBLICATIONS

Office Action dated Mar. 1, 2016 in U.S. Appl. No. 14/419,841.
Notice of Allowance dated Jul. 15, 2016 in U.S. Appl. No. 14/419,841.

* cited by examiner

PRIOR ART

LIGHT EMITTING DEVICE AND METHOD FOR MANUFACTURING LIGHT EMITTING DEVICE

This application is a divisional application of U.S. patent application Ser. No. 14/419,841 filed Feb. 5, 2015, which is the U.S. national phase of International Application No. PCT/JP2013/068966 filed Jul. 11, 2013, which designates the U.S. and claims priority to Japanese Application No. 2012-174009 filed Aug. 8, 2012, the entire contents of each of which are hereby incorporated by reference.

The present invention relates to a light emitting device that is applicable as a light source or the like to a lighting device and a display device, and a method for manufacturing the light emitting device.

TECHNICAL FIELD

Background Art

Conventionally, a wide range of development has been made in the field of the lighting devices and the display devices which use light emitting elements (which may also be called semiconductor light emitting elements) as a light source. In a known light emitting device, a wiring pattern is formed on a substrate, and a light emitting chip mounted on the substrate is connected to the wiring pattern by die-bonding. Further in this light emitting device, an alignment mark is formed on the substrate in order to position the substrate in the step of die-bonding the lighting emitting chip or in other steps.

In a conventional process, the alignment mark is plated simultaneously with the wiring pattern. However, since an alignment mark has a small area, when such an alignment mark is formed by plating, the current density in the alignment mark forming site increases during the plating and causes uneven plating in the plated layer. Disadvantageously, uneven plating hampers clear recognition of the alignment mark.

To reduce the defects due to uneven plating, Patent Literature 1 discloses integral formation of an alignment mark and a wiring pattern, and formation of a large-area alignment mark.

Additionally, for a small-area alignment mark, it is preferable to increase its adhesion property to the substrate in order to prevent its detachment from the substrate. For this purpose, Patent Literatures 2 and 3 employ the metal wiring and the insulated substrate which both contain glass components and thereby improve the adhesion property therebetween.

Prior Art Documents

Patent Literature

[Patent Literature 1] WO 2012/057038 A1
[Patent Literature 2] JP 2007-273914 A
[Patent Literature 3] JP H11-126971 A

DISCLOSURE OF THE INVENTION

Problems to be Solved by the Invention

The conventional technology disclosed by Patent Literature 1 avoids an increase in current density at the alignment mark forming site and to reduce uneven plating, by not forming a small-area alignment mark. Inevitably, the alignment mark formed by the plating process according to Patent Literature 1 has quite a large area.

Hence, the conventional technology according to Patent Literature 1 involves following problems.

(A) Freedom in the positioning of an alignment mark is limited.

(B) If an alignment mark is covered by a light reflecting resin frame, the resin frame needs a greater width and increases the area of the light emitting device.

(C) If an alignment mark is divided into small alignment marks, an additional step such as etching is required.

(D) If an alignment mark is formed integrally with the wiring pattern, the alignment mark is formed outside the wiring pattern and oriented outwardly.

Figure 5:
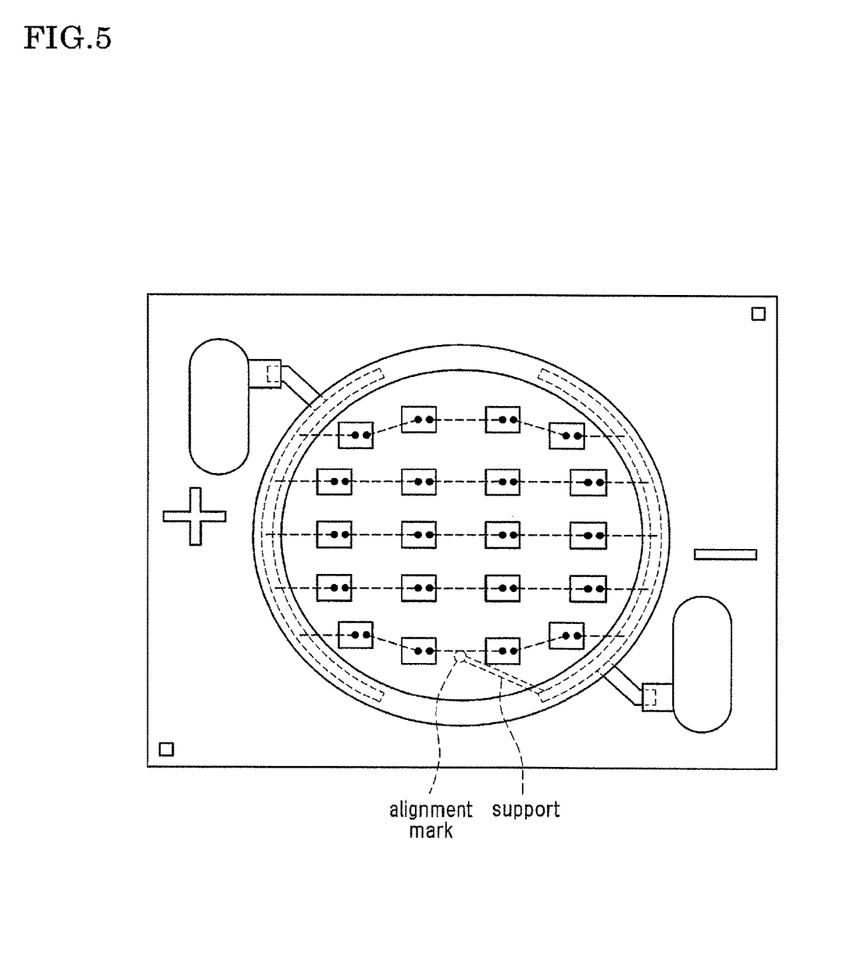
FIG. 5 is a top view of a configuration example of a conventional light emitting device.

For example, regarding the problem (A), plating of an alignment mark requires a support, as shown in FIG. 5, for passing an electric current through the alignment mark portion during the plating. Since this support should not overlap the positions of other wiring patterns and the light emitting elements, the position of the alignment mark is limited. Besides, to form an alignment mark separately as in FIG. 5, an additional step such as etching is required.

Figure 6:
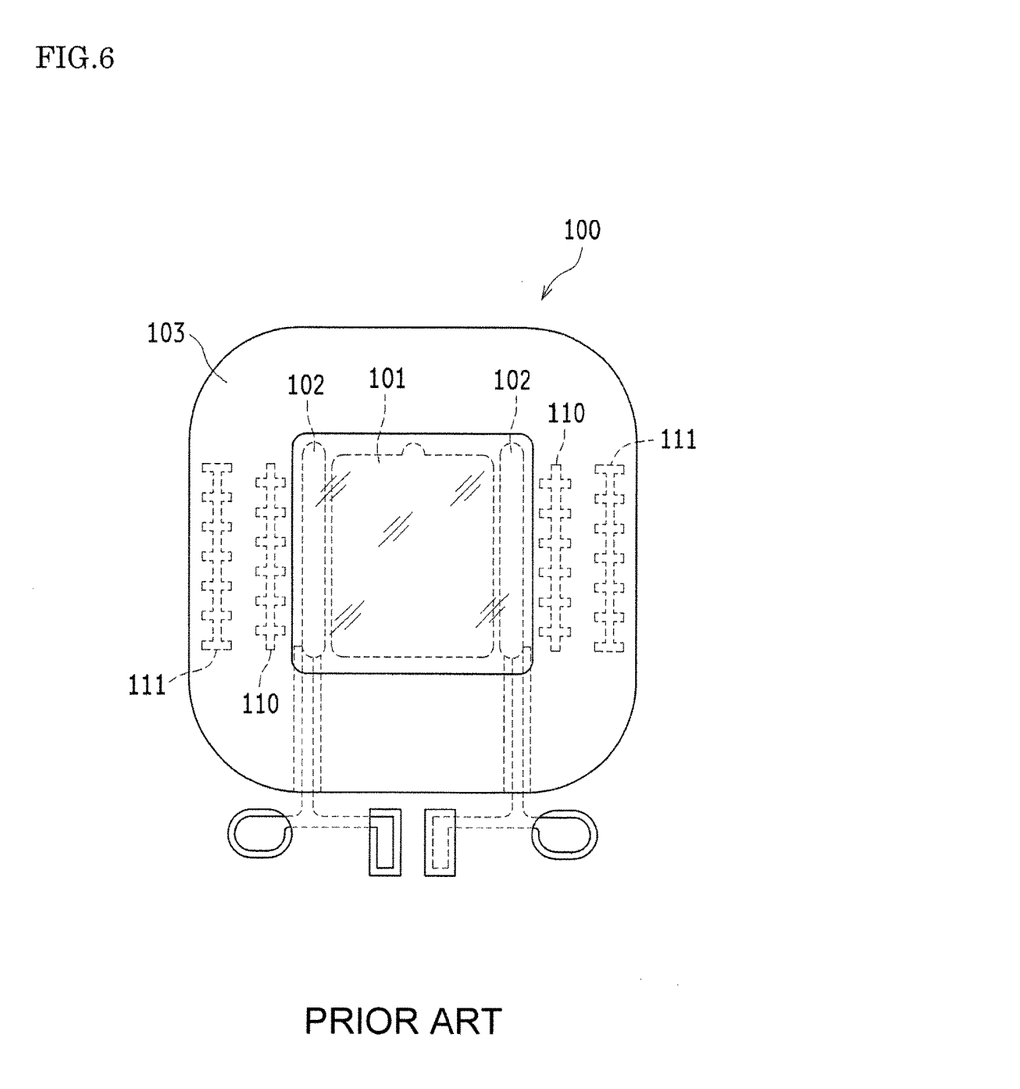
FIG. 6 is a top view of a configuration example of another conventional light emitting device.

Next, the problem (B) is discussed with reference to FIG. 6. FIG. 6 is a top view of a light emitting device 100 according to Patent Literature 1, provided with large-area alignment marks 110, 111.

The light emitting device 100 has a light emitting element forming region 101 and feed patterns 102 formed on each side thereof. Alignment marks 110, 111 are formed on the outside of the feed patterns 102. The light reflecting resin frame 103 surrounds the periphery of the light emitting element forming region 101 and the feed patterns 102. A sealing resin is filled in an area surrounded by the light reflecting resin frame 103 so as to protect the light emitting elements and the feed patterns 102. Preferably, the light emitting element forming region 101 is formed to cover the alignment marks 110, 111 for the following reason. If the alignment marks 110, 111 are exposed at the inner area of the frame without being covered by the light emitting element forming region 101, the exposed alignment marks 110, 111 absorb light and deteriorate the light extraction efficiency in the light emitting device 100. However, if the alignment marks 110, 111 have a large area, the light reflecting resin frame 103 also needs to have a greater area, so that the light emitting device 100 as a whole is unfavorably enlarged.

The present invention is made in view of these problems, and intends to provide a light emitting device which does not suffer from the defects due to uneven plating and which is provided with an alignment mark having a small area and a high freedom of positioning. The present invention also intends to provide a method for manufacturing the light emitting device.

Means for Solving the Problems

In order to solve the above-mentioned problems, a light emitting device according to the present invention includes: a substrate; a light emitting element disposed on the substrate; a conductor wiring disposed on the substrate; and an alignment mark disposed on the substrate. In this light emitting device, the alignment mark and the conductor wiring are formed by printing.

According to this configuration, since the alignment mark is formed by printing, it is possible to avoid the defects due to uneven plating and to provide a clearly readable alignment mark. Besides, printing of the alignment mark does not require a support for passing an electric current through the alignment mark portion during the plating. Hence, an alignment mark which has a small area and a high freedom of positioning can be formed easily.

Further, since the alignment mark and the conductor wiring are both formed by printing, it is possible to form the alignment mark and the conductor wiring simultaneously, and thereby to avoid an additional manufacture step.

The light emitting device may further include a light reflecting resin frame formed to surround a mounting area of the light emitting element, and the alignment mark and the conductor wiring may be covered by the light reflecting resin frame.

According to this configuration, since the alignment mark and the conductor wiring are covered by the light reflecting resin frame, it is not only possible to enhance the appearance of the light emitting device, but also possible to prevent absorption of light by the alignment mark and the conductor wiring and to improve the light extraction efficiency in the light emitting device.

The light emitting device may further include a light reflecting resin frame formed to surround a mounting area of the light emitting element. In this light emitting device, the alignment mark may be disposed outside the conductor wiring. The conductor wiring may be covered by the light reflecting resin frame, and the alignment mark may not be covered by the light reflecting resin frame.

If the alignment mark is formed outwardly of and away from the conductor wiring, this configuration can prevent an excessive increase in the width of the light reflecting resin frame which covers the alignment mark.

The light emitting device may further include: a light reflecting resin frame formed to surround a mounting area of the light emitting element; and a pair of lands opposed to each other about a center of the light reflecting resin frame. In this light emitting device, the lands may not be covered by the light reflecting resin frame.

In the light emitting device, the substrate may be a ceramic substrate containing a glass component, and the conductor wiring and the alignment mark may contain a same glass component as the glass component in the substrate.

According to this configuration, in the baking step after the printing of the alignment mark, the glass component in the substrate and the glass component in the alignment mark are diffused into each other. As a result, the alignment mark shows an improved adhesion property to the substrate, which prevents detachment of a small-area alignment mark.

In the light emitting device, each of the conductor wiring and the alignment mark may have a double layer structure composed of a first layer which is tightly adhered to the substrate and rich in glass component, and a second layer which is laid on the first layer and which contains no glass component or a small amount of glass component.

Alternatively, in the light emitting device, the conductor wiring may have a double layer structure composed of a first layer which is tightly adhered to the substrate and rich in glass component, and a second layer which is laid on the first layer and which contains no glass component or a small amount of glass component, and the alignment mark may have a single layer structure composed only of a first layer which is tightly adhered to the substrate and rich in glass component.

According to these configurations, the first layer improves the adhesion property of the conductor wiring and the alignment mark to the substrate. Further, irrespective of the mutual diffusion of the glass components, the second layer of the conductor wiring which contains a small amount of glass component (needle crystal disclosed in Patent Literature 2) can reduce wire attachment failure (insufficient adhesion) due to a repelling action in the wire-bonding process.

In the light emitting device, the lands for supplying power to the light emitting element may have a double layer structure composed of a first layer which is tightly adhered to the substrate and rich in glass component, and a second layer which is laid on the first layer and which contains no glass component or a small amount of glass component.

When the lands are soldered, this configuration reduces insufficient soldering by allowing the second layers of the lands and the solder to attach well. Besides, since the second layer is less affected by the mutual diffusion of the glass components and keeps an electric resistance inherent to the metal, this configuration reduces the electrical influence on the light emitting device.

Also in order to solve the above-mentioned problems, a method for manufacturing a light emitting device according to the present invention includes: a first step of forming a conductor wiring and an alignment mark on a substrate by printing; a second step of positioning the substrate with reference to the alignment mark formed in the first step, mounting a light emitting element on the substrate, and connecting the mounted light emitting element and the conductor wiring by a wire; a third step of forming a light reflecting resin frame to surround a mounting area of the light emitting element; and a fourth step of filling a sealing resin in an area surrounded by the light reflecting resin frame.

Similar to the light emitting device of the present invention, the thus configured manufacturing method can easily form an alignment mark which has a small area and a high freedom of positioning. Besides, this method can form the alignment mark and the conductor wiring simultaneously, without an additional manufacture step.

Effect of Invention

Since the present invention forms an alignment mark by printing, it is possible to avoid the defects due to uneven plating and to provide a clearly readable alignment mark. It is also possible to form an alignment mark which has a small area and a high freedom of positioning easily.

MODE FOR CARRYING OUT THE INVENTION

Hereinafter, embodiments of the present invention are described in detail with reference to the drawings. The light emitting device according to the present invention can be used as a light source for a lighting device, a display device, and the like. In the following description, the plan view in FIG. 1 is taken as a top view.

—Arrangement of a Light Emitting Device—

Figure 1:
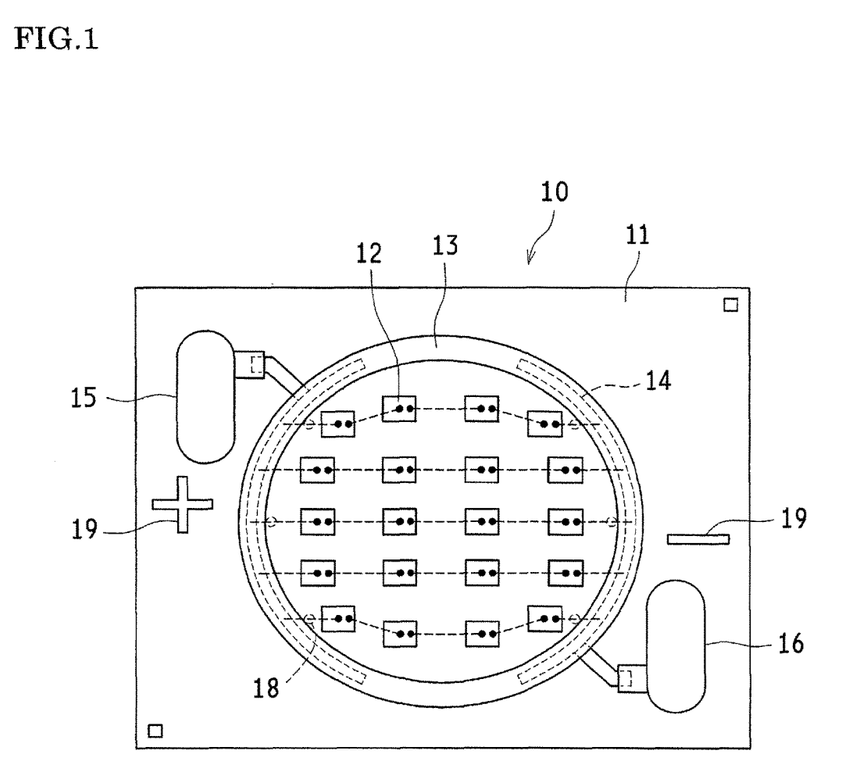
FIG. 1 is a top view showing a configuration example of the light emitting device according to the present invention.

FIG. 1 is a top view showing a configuration example of a light emitting device 10 according to the present embodiment. The light emitting device 10 employs light emitting elements (which may also be called semiconductor light emitting elements), and is generally equipped with a substrate 11, light emitting elements 12, a light reflecting resin frame 13, and a sealing resin.

The substrate 11 is a single-layer ceramic substrate made of ceramics. The external shape of the substrate 11 is rectangular in top view. The light emitting elements 12, the light reflecting resin frame 13, and the sealing resin are provided on one surface of the substrate 11 (hereinafter as "front surface"). In addition, conductor wirings 14, lands composed of an anode electrode 15 and a cathode electrode 16, alignment marks 18, polarity marks 19, etc. are directly formed on the front surface of the substrate 11.

The conductor wirings 14 are electrodes routed for electrical connection, and are electrically connected to the light emitting elements 12 by wire-bonding, The anode electrode 15 and the cathode electrode 16 are electrodes (lands) for supplying power to the light emitting elements 12, and are connectable to an external power source of the light emitting device 10. On the front surface of the substrate 11, the anode electrode 15 and the cathode electrode 16 are disposed in the vicinity of diagonal corners (the top left corner and the bottom right corner in FIG. 1). Namely, the anode electrode 15 and the cathode electrode 16 constitute a pair of lands that are opposed to each other about the center of the light reflecting resin frame.

A protection element (not shown) may also be formed on the front surface of the substrate 11. The protection element serves as a resistor element for protecting the light emitting elements 12 from electrostatic discharge, and is parallel-connected to a circuit in which the plurality of light emitting elements 12 are series-connected. The protection element may be composed, for example, of a printed resistor or a zener diode. If a zener diode is employed for the protection element, the zener diode is die-bonded on the wiring pattern, and is electrically connected to a desired wiring by wire-bonding. Also in this case, the zener diode is parallel-connected to a circuit in which the plurality of light emitting elements 12 are series-connected.

The alignment marks 18 are mainly utilized for positioning of the substrate 11 or for like work in the bonding step (die-bonding or wire-bonding). The alignment marks 18 are made of a metallic film so as to be light reflective. The position of the substrate 11 is recognized when a manufacturing machine (such as a bonding machine) reads the light reflected by the alignment marks 18.

The polarity marks 19 enable visual recognition of the polarity of the anode electrode 15 and the cathode electrode 16. Hence, it is preferable to form a plus-shaped polarity mark 19 near the anode electrode 15 and to form a minus-shaped polarity mark 19 near the cathode electrode 16.

The light emitting elements 12 are, for example, blue light emitting elements whose emission peak wavelength is in the vicinity of 450 nm, but should not be limited thereto. For example, the light emitting elements 12 may also be ultraviolet (near-ultraviolet) light emitting elements whose emission peak wavelength is 390 nm to 420 nm, for an improved luminous efficiency. A plurality of (twenty in this embodiment) light emitting elements 12 are mounted at predetermined positions on the front surface of the substrate 11 in such a manner as to satisfy a required amount of luminescence. The light emitting elements 12 are electrically connected by wire-bonding with use of wires 20 (for example, gold wires).

The light reflecting resin frame 13 reflects the light from the light emitting elements 12, and prevents absorption of light by the conductor wirings 14. The light reflecting resin frame 13 also serves as a retainer for the conductor wirings 14. The light reflecting resin frame 13 is provided, for example, in annular shape in top view to surround the mounting area where all light emitting elements 12 are mounted. In addition, the light reflecting resin frame 13, configured to cover the conductor wirings 14, prevents absorption of light by the conductor wirings 14. For this purpose, if the light reflecting resin frame 13 is formed in annular shape, the conductor wirings 14 are formed in arc-like shape as a part of the annular shape. Similarly, if the protection element composed of a printed resistor (or a part of the protection element) is provided, the protection element composed of a printed resistor is also formed in arc-like shape as a part of the annular shape, and is covered by the light reflecting resin frame 13. Then, the light reflecting resin frame 13 can also prevent absorption of light by the protection element. The light reflecting resin frame 13 is composed of, for example, but not limited to, an alumina filler-containing silicone resin, or may be composed of an insulating resin having light reflecting characteristics. Additionally, the shape of the light reflecting resin frame 13, the conductor wirings 14, and the protection element is not limited to the annular (arc-like) shape as mentioned above, but may be optionally selected.

The sealing resin is a sealing resin layer composed of a translucent resin, and is filled in an area surrounded by the light reflecting resin frame 13. Namely, the sealing resin is formed on the mounting area of the light emitting elements 12 and seals the light emitting elements 12, the wires 20, etc.

The sealing resin may contain a phosphor. This phosphor is excited by a first-order beam emitted from the light emitting elements 12, and emits light that has a longer wavelength than the first-order beam. The phosphor may be suitably selected in accordance with the required degree of whiteness. Exemplary combinations for neutral white or incandescent light color include a combination of YAG yellow phosphor and (Sr, Ca)AlSiN3:Eu red phosphor, and a combination of YAG yellow phosphor and CaAlSiN3:Eu red phosphor. Further, an example of high color rendering combinations is a combination of (Sr, Ca)AlSiN3:Eu red phosphor and Ca3(Sc, Mg)2Si3O12:Ce green phosphor. However, the phosphor should not be limited to these examples, and may be a combination of other phosphors. Additionally, as pseudo white, the phosphor may be composed only of YAG yellow phosphor.

—Method for Manufacturing the Light Emitting Device—

Next, the description turns to the method for manufacturing the light emitting device 10 having the above-mentioned configuration. As the light emitting device 10, a group of light emitting devices are formed as an integral body, and separated from each other in the last manufacturing step by dicing the periphery (four sides) of individual light emitting devices. For convenience, however, the following description and illustrations focus on one of such light emitting devices.

<Conductor Wiring Forming Step>

FIGS. 2(a)-(d) show the process for manufacturing the light emitting device 10.

Figure 2:
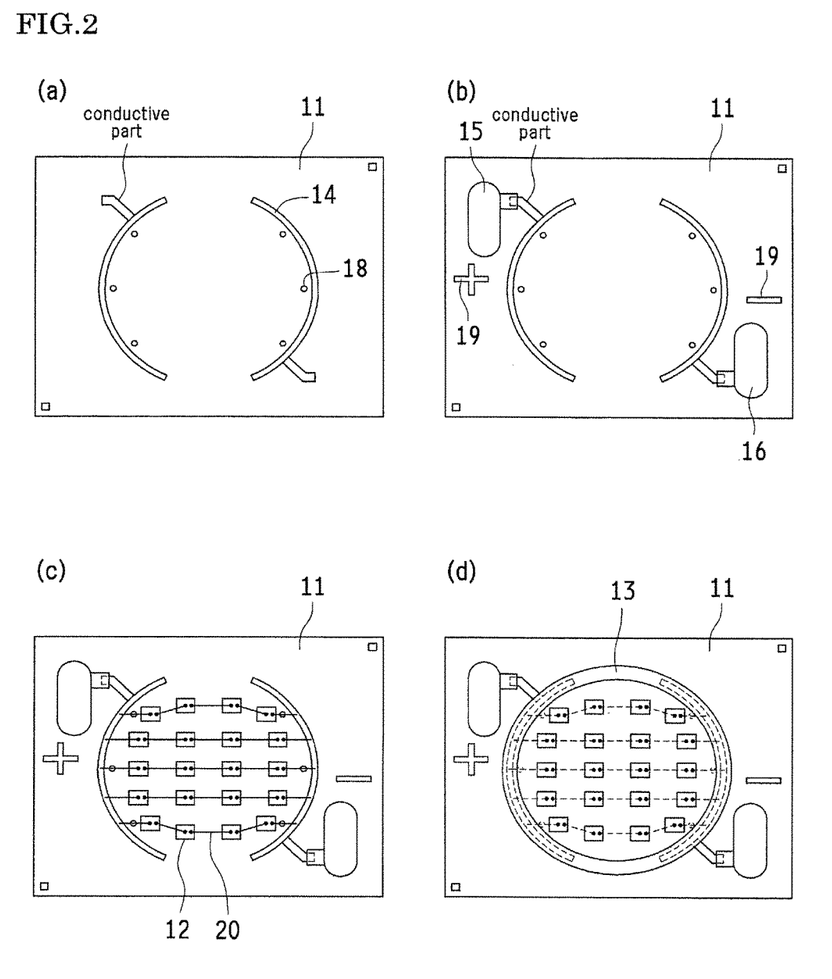
FIGS. 2(a)-(d) show the procedure of manufacturing the light emitting device shown in FIG. 1.

First, as shown in FIG. 2(a), the conductor wirings 14, a part of a conductive part for electrically connecting the conductor wirings 14 and the lands, and the alignment marks 18 are formed on the substrate 11. In this embodiment, these components are formed by printing. Specifically, the conductor wirings 14, the conductive part, and the alignment marks 18 are formed by gold paste printing (film thickness: 2 μm or more), followed by drying, and baking at 850° C. or higher.

The light emitting device 10 according to this embodiment is characterized in that the alignment marks 18 are formed by printing. Namely, by printing the alignment marks 18, it is possible to avoid the problem of uneven plating which occurs when alignment marks are formed by plating, and hence possible to provide clearly recognizable alignment marks. Besides, small-area alignment marks can be formed at optional positions without any limitation on positioning. Eventually, it is possible to reduce absorption of light by the alignment marks and to improve the light extraction efficiency in the light emitting device 10.

Next, as shown in FIG. 2(b), the lands (i.e. the anode electrode 15 and the cathode electrode 16), and a part of the conductive part for electrically connecting the conductor wiring 14 and the lands are formed on the substrate 11. In this embodiment, these components are formed by printing. Specifically, the lands and the conductive part are formed by silver (or silver-platinum, silver-palladium) paste printing (film thickness: 18 μm or more), followed by drying, and baking at 850° C. or higher.

Further, polarity marks 19 are formed by printing. The polarity marks are formed by gold paste printing (film thickness: 18 μm or more), followed by drying, and baking at 850° C. or higher. Additionally, marks indicative of the substrate model number may be also formed concurrently with the polarity marks.

In the case where a protection element is provided, the protection element may be formed on the substrate 11 as a printed resistor by the manufacturing steps which include printing and baking. In the printing step, a paste containing a resistor component is screen printed on a predetermined position in such a manner as to overlap an end of the conductor wirings 14 (such that a part of the paste contacts an upper side of the conductor wirings 14). The paste is composed of ruthenium dioxide (RuO2, containing ruthenium as conductive powder), binder, a resin, and a solvent. In the baking step, the printed paste is fixed on the substrate 11 to provide a protection element. The conductive powder is not limited to ruthenium but may be a metal or an oxide that does not soften at or below the baking temperature.

<Light Emitting Element Mounting Step>

Next, as shown in FIG. 2(c), the light emitting elements 12 are mounted on the substrate 11. Specifically, the light emitting elements 12 are die-bonded by means of, for example, an adhesive resin such as a silicone resin. In this embodiment, twenty light emitting elements 12 are disposed in the area surrounded by the conductor wirings 14.

Each light emitting element 12 is a chip whose external shape is rectangular in top view, having a thickness of, for example, 100 to 180 μm. On the rectangular top surface of the light emitting element 12, a chip electrode for the anode and a chip electrode for the cathode are provided in a longitudinally opposed manner. The light emitting elements 12 are substantially arranged in rows. In this embodiment, the light emitting elements 12 are provided in four-by-five arrangement.

Next, these light emitting elements 12 are wire-bonded with use of wires 20. For the light emitting elements 12 adjacent to the conductor wirings 14, the chip electrodes are wire-bonded to the conductor wirings 14. For the light emitting elements 12 which are adjacent to each other but not adjacent to the conductor wirings 14, the chip electrodes of the adjacent light emitting elements are directly wire-bonded to each other. As a result, there are five series circuit units in each of which four light emitting elements 12 are series-connected, and the five series circuit units are parallel connected to each other between the anode electrode 15 and the cathode electrode 16.

<Second Light Reflecting Resin Layer Forming Step>

Then, as shown in FIG. 2(d), the light reflecting resin frame 13 is formed over the conductor wirings 14. Specifically, for example, a resin discharging device (not shown) equipped with a nozzle having a circular mouth is employed to eject an alumina filler-containing liquid silicone resin from the nozzle so as to draw a shape at a predetermined position. A heat curing treatment at a curing temperature of 120° C. for a curing time of one hour is carried out to form the light reflecting resin frame 13. The above-mentioned curing temperature and curing time are merely given as an example and should not be limitative.

The light reflecting resin frame 13 has a width of, for example, 0.9 mm. The uppermost part of the light reflecting resin frame 13 is higher than the top surface of the light emitting elements 12, and is also higher than the wires 20 (wire loops) connecting the light emitting elements 12. Owing to this arrangement, a sealing resin can be formed to avoid exposure of the light emitting elements 12 and the wires 20 and can protect these components.

The wires 20 connected to the conductor wirings 14 are at least partly covered by the light reflecting resin frame 13. Hence, it is possible to decrease or prevent detachment of wires. On the other hand, the lands (i.e. the anode electrode 15 and the cathode electrode 16) are not covered by the light reflecting resin frame 13.

In the light emitting device 10 according to this embodiment, the alignment marks 18 may be located in the forming area of the light reflecting resin frame 13, and may be covered by the light reflecting resin frame 13. If the alignment marks 18 are covered by the light reflecting resin frame 13, it is not only possible to enhance the appearance of the light emitting device 10, but also possible to prevent absorption of light by the alignment marks 18 and improve the light extraction efficiency. Having said that, the alignment marks 18 may not be necessarily covered by the light reflecting resin frame 13. Even if the alignment marks 18 are not covered by the light reflecting resin frame 13, the light emitting device 10 according to this embodiment can still minimize absorption of light by the alignment marks 18, by decreasing the area of alignment marks 18.

In the above description, the resin discharging device is equipped with a nozzle having a circular mouth. The nozzle is not limited thereto, and may be selected by, for example, the shape of the light reflecting resin frame 13 to be drawn (annular in this embodiment). When such a nozzle is employed, the resin is ejected from the mouth at a burst to make a seamless annular light reflecting resin frame 13 in a short time. In other words, the light reflecting resin frame 13 can be formed without a bump at a seam, while reducing leakage of the sealing resin.

<Sealing Resin Forming Step>

In this step, the sealing resin is formed on the substrate 11. Specifically, a phosphor-containing resin in which a phosphor is dispersed in a liquid translucent resin is injected to fill the area surrounded by the light reflecting resin frame 13. After the phosphor-containing resin is injected, the resin is allowed to cure at a predetermined temperature for a predetermined time. Eventually, the light emitting elements 12 and the wires 20 are covered and protected by the sealing resin.

<Substrate Dividing Step>

Through the above-mentioned steps, the plurality of light emitting devices 10 are formed on a single substrate. Lastly, the substrate is divided along division lines to provide individual light emitting devices 10. For a dividing process, division grooves are provided in the back surface of the substrate 11 along the division lines. Then, the substrate 11 is cut on the front surface over the division grooves by a division blade. According to this process, the substrate 11 is caused to crack along the division grooves and can be divided in a simple manner. The plurality of integrated light emitting devices 10 can be thus divided into individual light emitting devices 10.

Modified Examples

In the light emitting device 10 shown in FIG. 1, the alignment marks 18 are provided inside the conductor wirings 14. Alternatively, as in the light emitting device 30 illustrated in FIG. 3, the alignment marks 18 may be provided outside the conductor wirings 14. If the alignment marks 18 are provided outside the conductor wirings 14, it is sometimes better not to cover the alignment marks 18 with the light reflecting resin frame 13, for the following reasons. In the case where the alignment marks 18 are formed outwardly of and away from the conductor wirings 14, the light reflecting resin frame 13 will have an excessive width in order to cover such alignment marks 18. Besides, when the alignment marks 18 are located outside the conductor wirings 14, the alignment marks 18 do not absorb light even if they are not covered by the light reflecting resin frame 13. Hence, it is unnecessary to cover the alignment marks 18 with the light reflecting resin frame 13.

Figure 3:
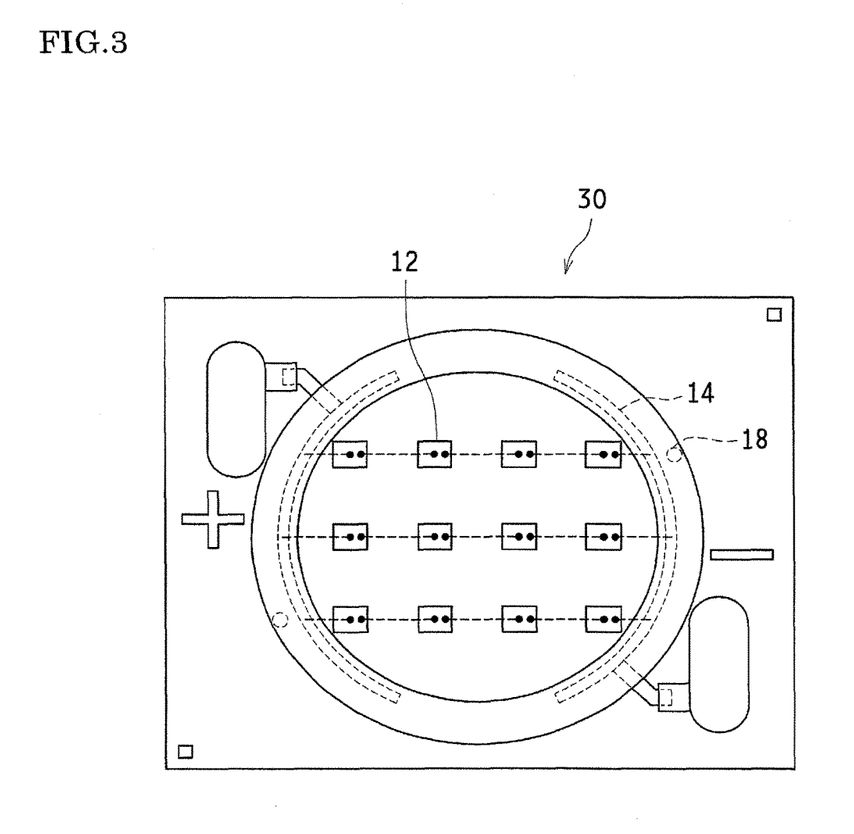
FIG. 3 is a top view showing another configuration example of the light emitting device according to the present invention.

Incidentally, if a large number of light emitting elements, as many as those shown in FIG. 1, are mounted on the substrate 11, the light emitting element mounting region may be so large as to be beyond the recognition region of the alignment mark recognition apparatus, so that the alignment marks 18 may not be recognized in the chip die-bonding step. Such a recognition failure can be reduced by locating the alignment marks 18 inside the conductor wirings 14 (inside the light reflecting resin frame 13). If a small number of light emitting elements, as little as those shown in FIG. 3, are mounted on the substrate 11, the light emitting element mounting region is small enough, so that the alignment marks 18 may be positioned outside the conductor wirings 14 (outside the light reflecting resin frame 13). Namely, regardless of whether the area of the light emitting element mounting region is large or small, the same recognition apparatus can be used by adjusting the positions of the alignment marks 18. Eventually, just as the light emitting device 10 according to this embodiment, it is extremely important to form small-area alignment marks 18 by printing and to enable free positioning of the alignment marks 18.

In the light emitting device 30 shown in FIG. 3, the arrangement of the light emitting elements 12 is different from the arrangement in the light emitting device 10 shown in FIG. 1. Specifically, in the light emitting device 10, the light emitting elements 12 in the topmost and bottommost rows in the drawings are arranged in arc-like shape along the shape of the light reflecting resin frame 13. In contrast, in the light emitting device 30, all rows of the light emitting elements 12 are arranged in a straight line. The arrangement of the light emitting elements can be optionally designed in accordance with the light uniformity or other requirements for the light emitting device.

For the light emitting devices 10 and 30 according to this embodiment, it is preferable that the substrate 11 is a ceramic substrate, and that the printed conductor wirings 14, the printed lands, and the printed alignment marks 18 contain the same glass component as the one contained in the substrate 11. Then, in the baking step after the printing, the glass component in the substrate 11 and the glass component in the conductor wirings 14, the lands, and the alignment marks 18 are diffused into each other. As a result, the conductor wirings 14, the lands, and the alignment marks 18 show an improved adhesion property to the substrate 11. Where the alignment marks 18 have a small area as in this embodiment, an improved adhesion property to the substrate 11 can prevent detachment of the alignment marks 18 and can raise the production yield.

Additionally, in the case where the conductor wirings 14 and the alignment marks 18 are arranged to contain the same glass component as the one contained in the substrate 11, the conductor wirings 14 and the alignment marks 18 may have a double layer structure as shown in FIGS. 4(a)-(c). Specifically, in each of the conductor wirings 14 and the alignment marks 18, a first layer tightly adhered to the substrate 11 is rich in glass component, and a second layer laid on the first layer consists of a metal only (i.e. contains no glass component) or contains a small amount of glass component. Owing to this double layer structure, the conductor wirings 14 can have both an adhesion property to the substrate 11 and a good wire-bonding property to the light emitting elements 12. In other words, it is preferable for the front surfaces of the conductor wirings 14, which are electrically connected to the light emitting elements 12 by wire-bonding, to be free of glass component (a large amount of glass component is likely to cause wire detachment and insufficient wire attachment). The conductor wirings 14 having the double layer structure shown in FIG. 4(b) can eliminate or reduce the glass component in the front surface layers (the second layers) of the conductor wirings 14, thereby preventing wire detachment in the wire-bonding process. Or, the double layer structure can reduce wire attachment failure (insufficient adhesion) due to a repelling action in the wire-bonding process.

Further referring to FIG. 4(b), the lands (the anode electrode 15 and the cathode electrode 16) may also have a similar double layer structure. Namely, in each of the lands, a first layer tightly adhered to the substrate 11 is rich in glass component, and a second layer laid on the first layer consists of a metal only (i.e. contains no glass component) or contains a small amount of glass component. In the soldering process of the lands, this double layer structure reduces insufficient soldering by allowing the second layers of the lands to attach well to the solder. Besides, since the second layers are less affected by the mutual diffusion of the glass components and keep an electric resistance inherent to the metal, this structure reduces the electrical influence on the light emitting device.

Figure 4:
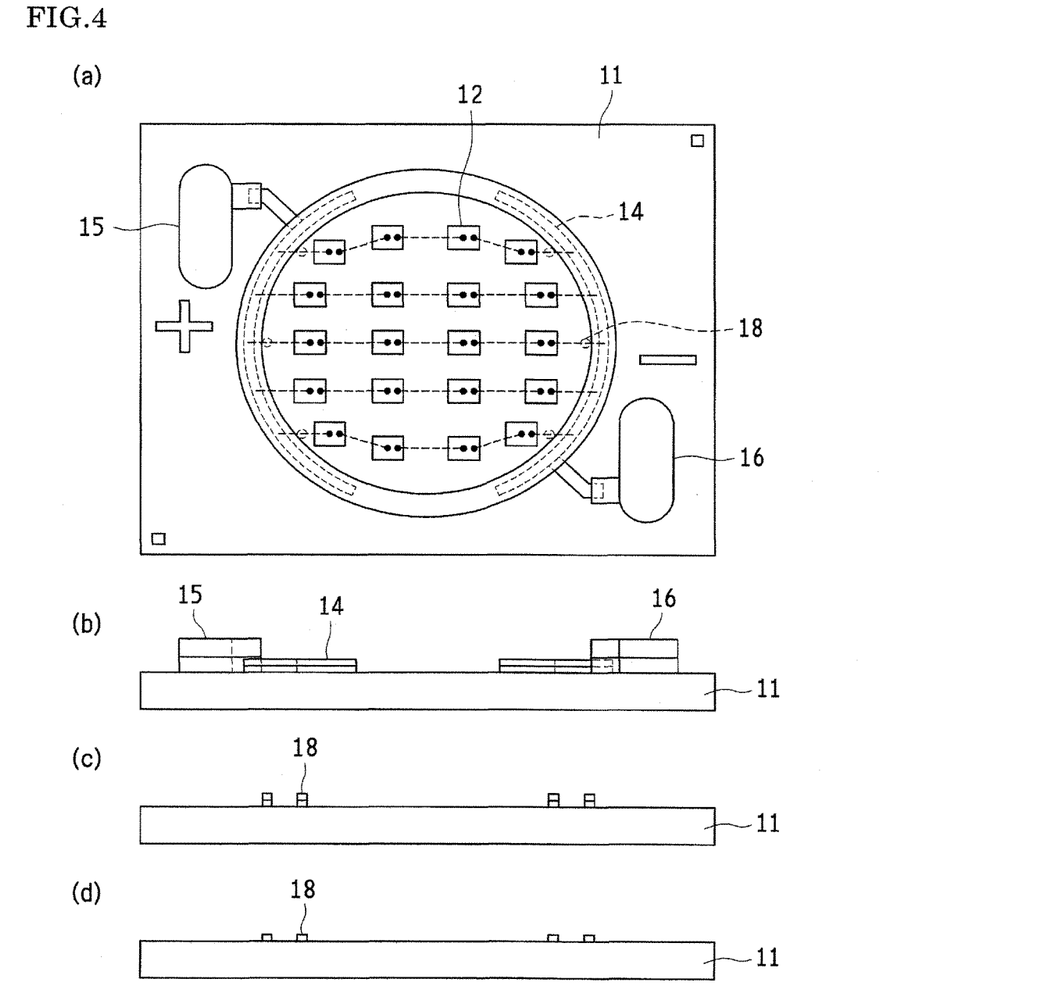
FIG. 4(a) is a top view showing yet another configuration example of the light emitting device according to the present invention.
FIG. 4(b) is a side view of the light emitting device, in which the conductor wirings have a two-layer structure.
FIG. 4(c) is a side view of the light emitting device, in which the alignment marks have a two-layer structure.
FIG. 4(d) is a side view of the light emitting device, in which the alignment marks have a single-layer structure.

Incidentally, the alignment marks 18, which are formed in the same printing step as the conductor wirings 14, may also have a double layer structure as shown in FIG. 4(*c*). Nevertheless, considering that the alignment marks 18 do not need to have any electrical function unlike the conductor wirings 14, the alignment marks 18 may have a single layer structure as shown in FIG. 4(*d*) (composed of a layer rich in glass component). To give this single layer structure, the alignment marks 18 are printed simultaneously with the first layers of the conductor wirings 14, and not printed when the second layers of the conductor wirings 14 are printed.

The present invention should not be limited to the above-described embodiments, and may be altered variously within the scope of claims. Other embodiments resulting from optional combinations of the technical measures disclosed in the different embodiments are also included in the technical scope of the present invention.

DESCRIPTION OF THE REFERENCE NUMERALS

10, 30 light emitting device
11 substrate
12 light emitting element
13 light reflecting resin frame
14 conductor wiring
15 anode electrode
16 cathode electrode
18 alignment mark
19 polarity mark

The invention claimed is:

1. A light emitting device comprising:
   an insulating substrate having a single layer structure;
   a light emitting element mounted and disposed on the insulating substrate by an adhesive resin;
   a conductor wiring disposed on the insulating substrate, the conductor wiring surrounding a light emitting element mounting area, the conductor wiring electrically connected with the light emitting element;
   at least one alignment mark;
   a pair of lands for supplying power to the light emitting element and opposed to each other across the mounting area of the light emitting element;
   at least one polarity mark formed in the vicinity of at least one of the lands and comprising a metal material; and
   an annular light reflecting resin frame, the light emitting element is surrounded by the annular light reflecting resin frame; wherein
   the conductor wiring is covered by the light reflecting resin frame,
   the at least one alignment mark is located inside the annular light reflecting resin frame in top view, and
   the alignment mark is not covered by the light reflecting resin frame.

2. The light emitting device according to claim 1, wherein visual recognitions of polarities of electrodes comprise a plus-shaped polarity mark formed near an anode electrode and a minus-shaped polarity mark formed near a cathode electrode.

3. The light emitting device according to claim 2, wherein the polarity marks for the anode and cathode are substantially disposed on opposite sides of the outside of the annular light reflecting resin frame.

4. The light emitting device according to claim 1, wherein the at least one alignment mark and the conductor wiring are formed by printing,
   wherein the at least one alignment mark is disposed in an opposed matter across the light emitting element mounting area, and
   wherein the at least one alignment mark is partially or entirely exposed without being covered by the light reflecting resin frame.

5. The light emitting device according to claim 1, further comprising a protection element disposed on the conductor wiring.

* * * * *